US012593658B2

(12) United States Patent
Seo et al.

(10) Patent No.: US 12,593,658 B2
(45) Date of Patent: Mar. 31, 2026

(54) SUBSTRATE TREATING APPARATUS

(71) Applicant: SEMES CO., LTD.,
Chungcheongnam-do (KR)

(72) Inventors: Jong Seok Seo, Chungcheongnam-do
(KR); Sun Sup Lim, Gyeonggi-do
(KR)

(73) Assignee: SEMES CO., LTD.,
Chungcheongnam-do (KR)

( * ) Notice: Subject to any disclaimer, the term of this
patent is extended or adjusted under 35
U.S.C. 154(b) by 456 days.

(21) Appl. No.: 18/119,287

(22) Filed: Mar. 9, 2023

(65) Prior Publication Data

US 2024/0203783 A1 Jun. 20, 2024

(30) Foreign Application Priority Data

Dec. 20, 2022 (KR) ........................ 10-2022-0178841

(51) Int. Cl.
H01L 21/687 (2006.01)
H01L 21/67 (2006.01)
*H01L 21/683* (2006.01)
(52) U.S. Cl.
CPC .. *H01L 21/68742* (2013.01); *H01L 21/67103*
(2013.01); *H01L 21/67109* (2013.01); *H01L*
*21/68707* (2013.01); *H01L 21/6875* (2013.01);
*H01L 21/67248* (2013.01); *H01L 21/683*
(2013.01)
(58) Field of Classification Search
None
See application file for complete search history.

(56) References Cited

U.S. PATENT DOCUMENTS

| | | | |
|---|---|---|---|
| 12,025,921 B2 | 7/2024 | Kim et al. | |
| 2012/0088203 A1* | 4/2012 | Mizunaga | ........... H01L 21/6875 |
| | | | 432/253 |
| 2016/0035601 A1 | 2/2016 | Eum et al. | |

(Continued)

FOREIGN PATENT DOCUMENTS

| | | |
|---|---|---|
| JP | 2009-83012 | 4/2009 |
| KR | 10-2016-0017699 | 2/2016 |

(Continued)

OTHER PUBLICATIONS

Office Action dated May 21, 2024 for Korean Patent Application
No. 10-2022-0178841 and its English translation from Global
Dossier.

(Continued)

*Primary Examiner* — Binu Thomas
(74) *Attorney, Agent, or Firm* — WOMBLE BOND
DICKINSON (US) LLP

(57) ABSTRACT

A substrate treating apparatus includes: a chill plate; a first
support part installed on the chill plate and including a first
tip having a first height; and a second support part installed
on the chill plate and having a height changed according to
a temperature, wherein at a first temperature, a maximum
height of the second support part becomes equal to or lower
than a height of the first tip, such that the substrate is
supported by the first tip of the first support part, and at a
second temperature lower than the first temperature, the
second support part becomes higher than the first tip, such
that the substrate is supported by the second support part.

19 Claims, 9 Drawing Sheets

(56)  References Cited

U.S. PATENT DOCUMENTS

2020/0409275 A1 *  12/2020  Bang ................. H01L 21/68742
2022/0100096 A1 *   3/2022  Kim .................. H01L 21/68742

FOREIGN PATENT DOCUMENTS

| KR | 10-2000080 | 7/2019 | | |
| KR | 10-2021-0097536 | 8/2021 | | |
| KR | 20210097536 A | * | 8/2021 | ....... H01L 21/68742 |
| KR | 10-2022-0044052 | 4/2022 | | |
| KR | 10-2022-0093779 | 7/2022 | | |

OTHER PUBLICATIONS

Notice of Allowance dated Jan. 10, 2025 for Korean Patent Application No. 10-2022-0178841 and its English translation from Global Dossier.

* cited by examiner

[FIG. 1]
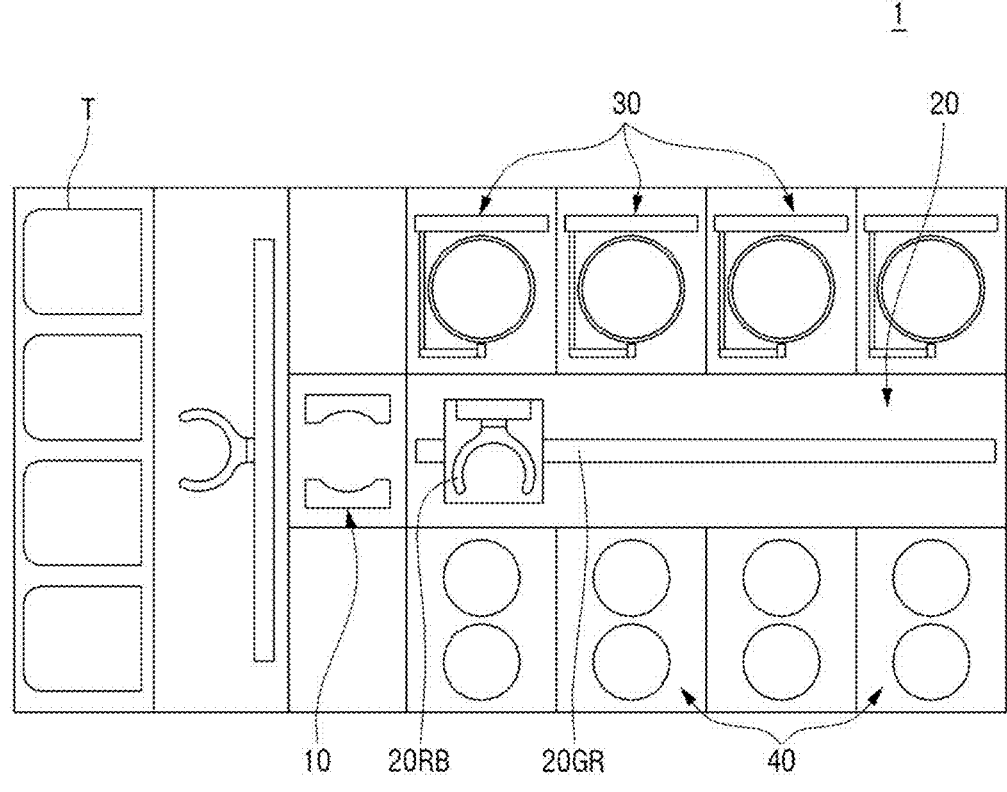

[FIG. 2]
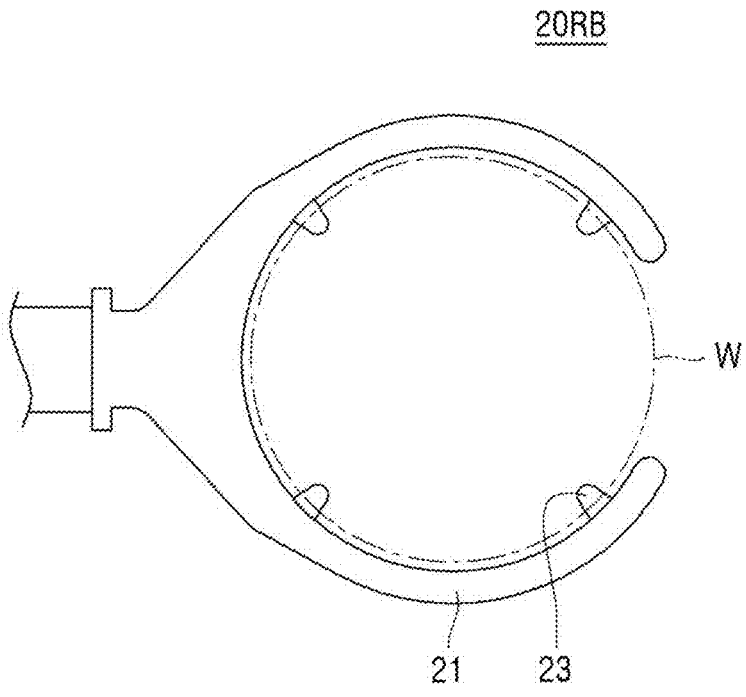
[FIG. 3]
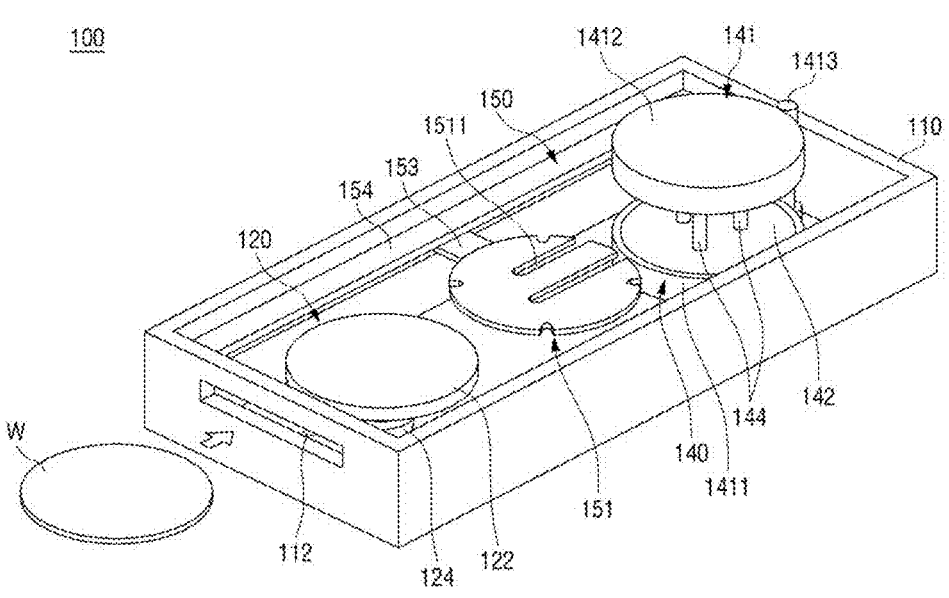

[FIG. 4]
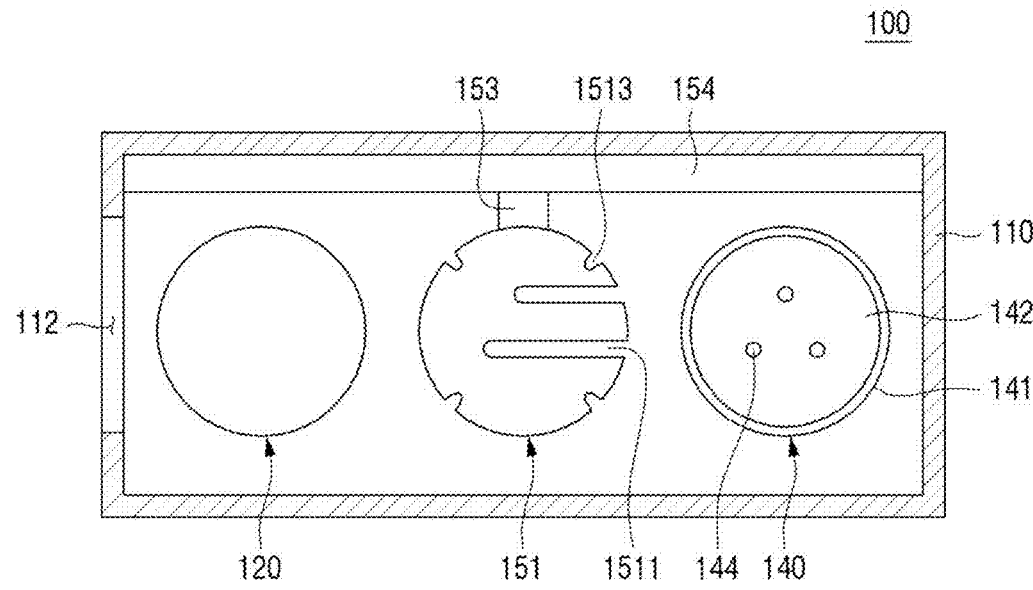
[FIG. 5]
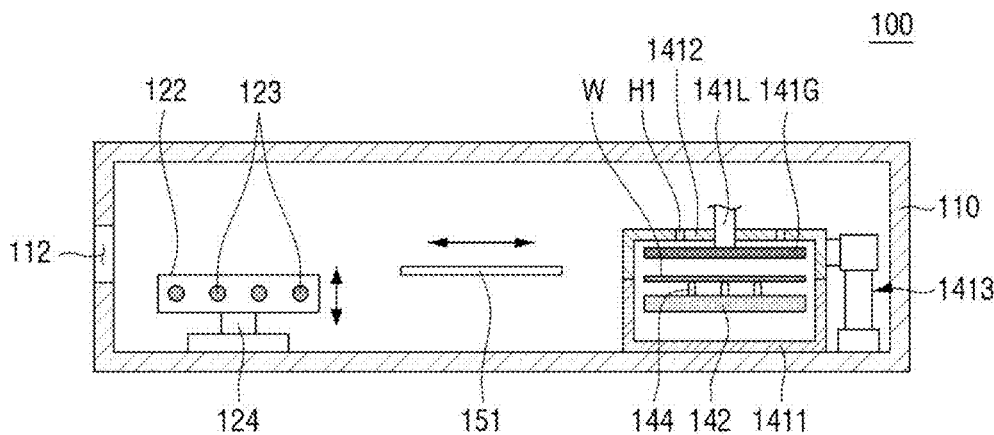

[FIG. 6]
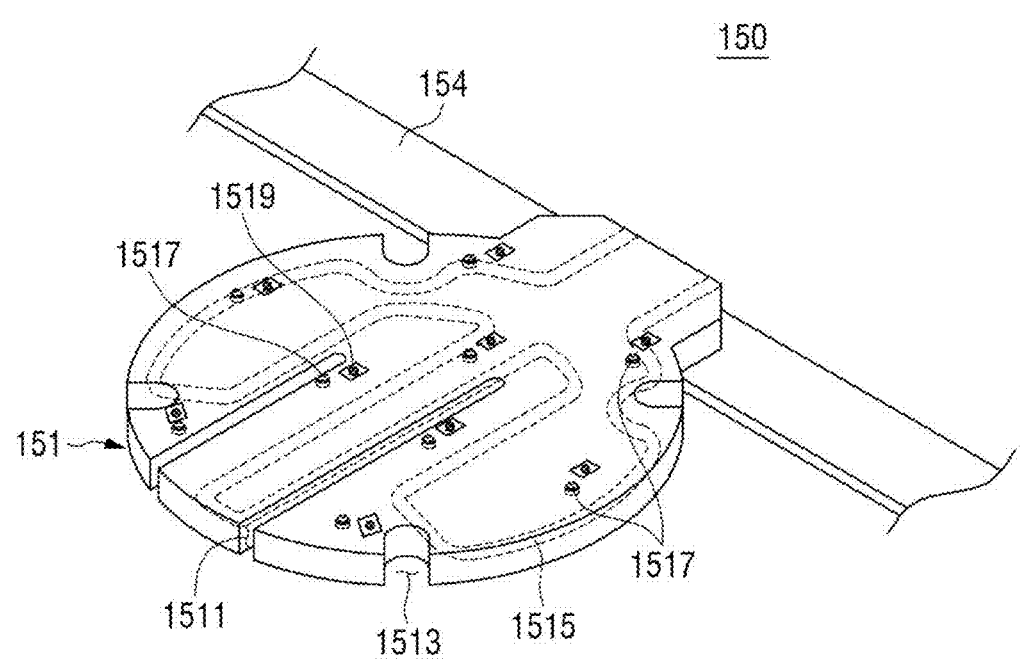

[FIG. 7]
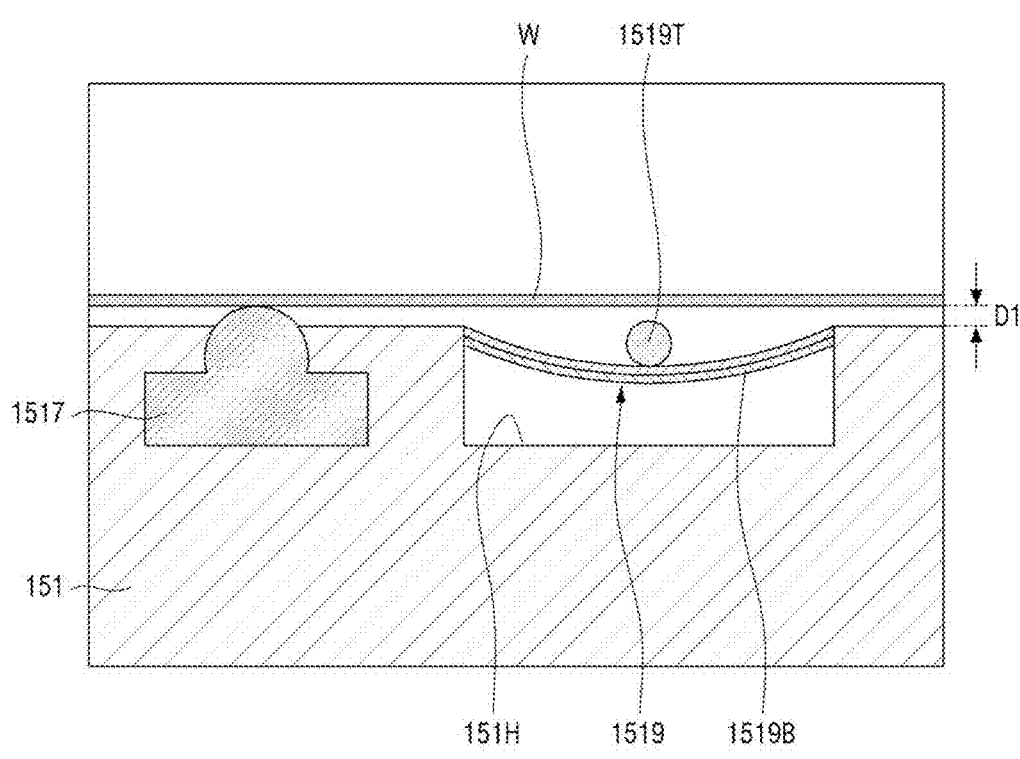

[FIG. 8]
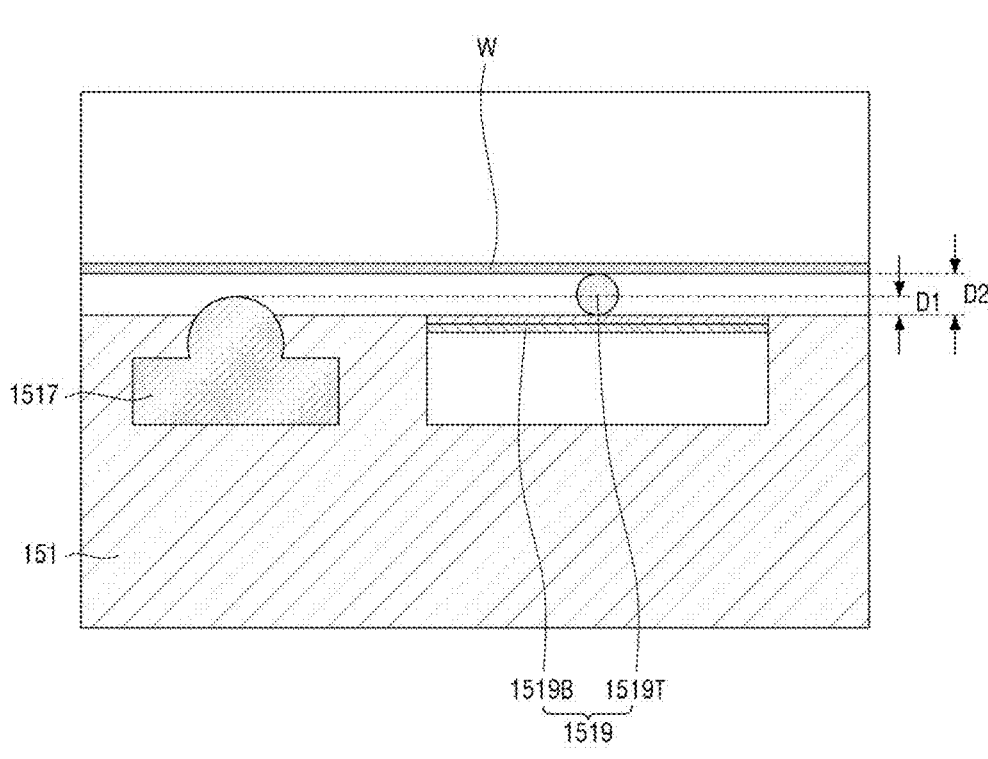

[FIG. 9]
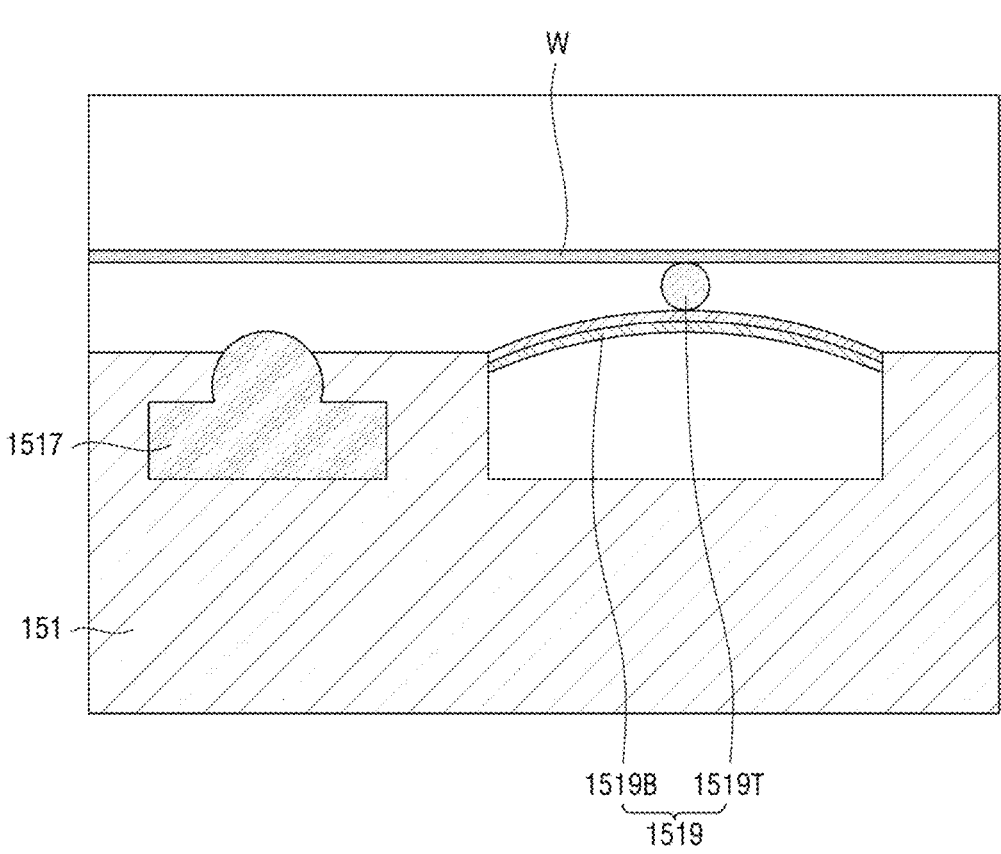

[FIG. 10]
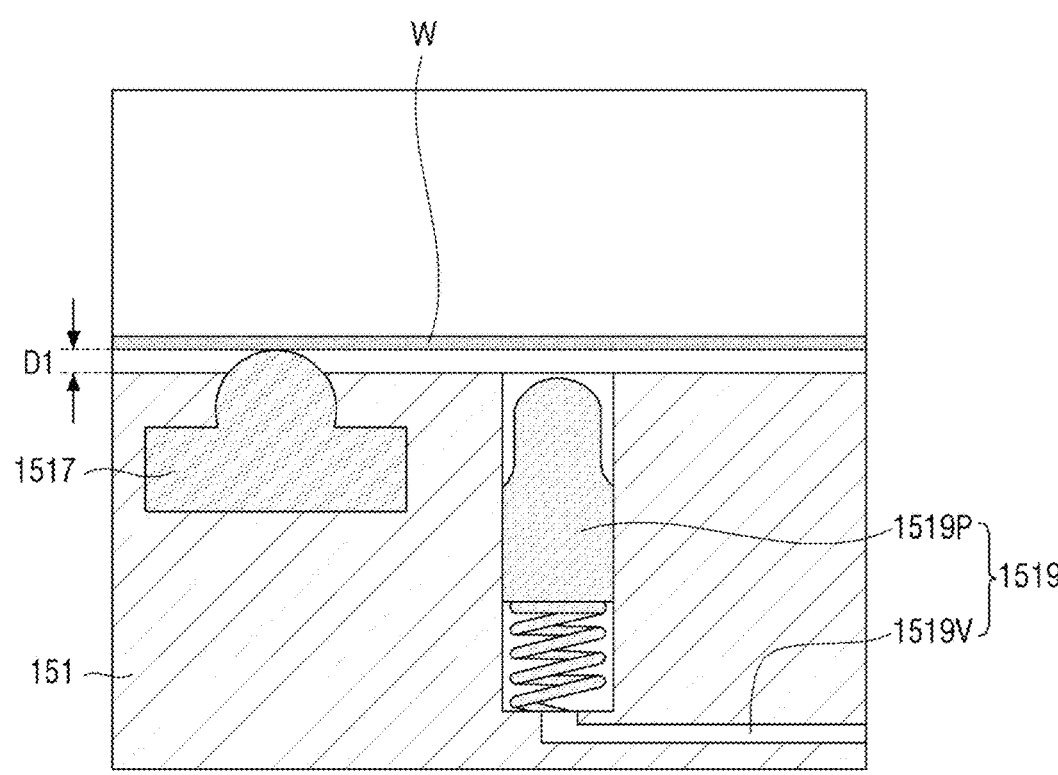

[FIG. 11]
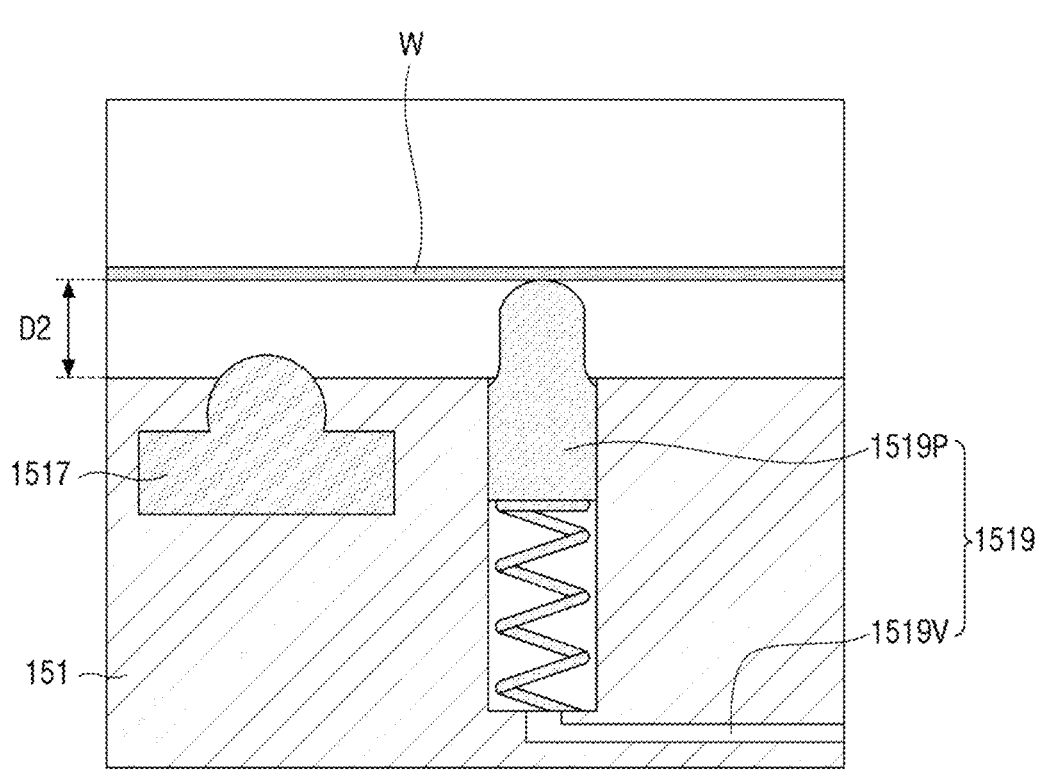

SUBSTRATE TREATING APPARATUS

CROSS-REFERENCE TO RELATED APPLICATION

This application claims priority from Korean Patent Application No. 10-2022-0178841 filed on Dec. 20, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate treating apparatus.

2. Description of the Related Art

Semiconductor devices are fabricated through a fabrication process for forming an electrical circuit including electric elements on a silicon wafer used as a semiconductor substrate, an electrical die sorting (EDS) process for inspecting electrical characteristics of semiconductor devices formed in the fabrication process, and a package assembly process for encapsulating and individualizing semiconductor devices with an epoxy resin.

The fabrication process includes a deposition process for forming a film on the wafer, a chemical mechanical polishing process for planarizing the film, a photolithography process for forming a photoresist pattern on the film, an etching process for forming the film into a pattern having electrical characteristics using the photoresist pattern, an ion implantation process for implanting specific ions into a predetermined area of the wafer, a cleaning process for removing impurities on the wafer, an inspection process for inspecting a surface the wafer on which the film or the pattern is formed, and the like.

The photolithography process includes a process of applying a photoresist on a wafer and then heating the photoresist, a process of exposing and then heating the photoresist, and a process of developing and then heating the photoresist. In addition, the photolithography process includes a cooling process of cooling the photoresist to a predetermined temperature after a heating process.

Heat treatment for heating and cooling the photoresist has an influence on the formation of the photoresist pattern. In particular, when a chemically amplified photoresist is used, a difference in an amount of heat applied to each portion of the photoresist at the time of heating the photoresist after exposing the photoresist has a great influence on the formation of circuit patterns. Therefore, a heat treating process is very important in the photolithography process.

SUMMARY

Meanwhile, in a baking process of heating a substrate, a cooling process is performed after heating the substrate. In this case, when a gap between a chill plate and the substrate is great, cooling efficiency may be reduced, and when the gap between the chill plate and the substrate is small, the substrate may be damaged due to a squeeze effect that the substrate is adsorbed when a robot of a transfer unit approaches the substrate. That is, the gap for rapidly transferring the substrate may decrease the cooling efficiency and the gap for rapidly cooling the substrate may damage the substrate, and thus, improvement is required.

Aspects of the present disclosure provide a substrate treating apparatus capable of optimizing both cooling efficiency of a substrate and a transfer speed of the substrate.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a substrate treating apparatus includes: a chill plate; a first support part installed on the chill plate and including a first tip having a first height; and a second support part installed on the chill plate and having a height changed according to a temperature, wherein at a first temperature, a maximum height of the second support part becomes equal to or lower than a height of the first tip, such that the substrate is supported by the first tip of the first support part, and at a second temperature lower than the first temperature, the second support part becomes higher than the first tip, such that the substrate is supported by the second support part.

According to another aspect of the present disclosure, a substrate treating apparatus includes: a cooling unit positioned at a first position and including a cooling plate cooling a substrate; a heating unit positioned at a second position and including a heating plate heating the substrate and lift pins provided to be elevated or lowered from the heating plate; a transfer unit including a chill plate supporting the substrate so as to transfer the substrate, an arm connected to the chill plate and moving between the first position and the second position, and a rail part provided to allow the arm to move; and a housing part having an accommodation space in which the cooling unit, the heating unit, and the transfer unit are accommodated and provided with an entrance through which the substrate goes in and out, wherein the transfer unit further includes: a first support part installed on the chill plate and including a first tip having a first height; and a second support part including a bimetal installed on the chill plate and having flatness or a bending direction changed according to a temperature and a second tip provided on the bimetal, at a first temperature, a maximum height of the second tip becomes equal to or lower than a height of the first tip, such that the substrate is supported by the first tip of the first support part, and at a second temperature lower than the first temperature, the second tip becomes higher than the first tip, such that the substrate is supported by the second tip of the second support part.

According to still another aspect of the present disclosure, a substrate treating apparatus includes: a chill plate having an accommodation groove formed to be concave downwardly, having a guide hole extending inward from an edge of the chill plate so that the chill plate does not interfere with lift pins penetrating through a heating plate and having a slit shape, having a cooling flow passage through which a cooling fluid passes, and having a first area constituting a central portion and a second area including an edge outside the first area; a plurality of first support parts installed on the chill plate, provided radially to be adjacent to the edge in the second area as compared with the first area, further provided radially to be spaced apart from each other at equal intervals in the first area, and including first tips having a height between 20 to 60 μm from the chill plate; and second support parts including bimetals installed on the chill plate and having flatness or a bending direction changed according to a temperature and second tips provided on the bimetals, and adjacent to the first support parts and provided in at least the same number as the number of first support parts, wherein at a first temperature, a maximum height of the second tip becomes equal to or lower than a height of the first tip, such that the substrate is supported by the first tip of the first support part, and at a second temperature lower than the first temperature, the second tip becomes higher than the first tip, such that a height of the second tip from the chill plate is 100 μm to 500 μm and the substrate is supported by the second tip of the second support part.

Detailed contents of other exemplary embodiments are described in a detailed description and are illustrated in the drawings.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a view illustrating a substrate treating apparatus according to some exemplary embodiments of the present disclosure;

FIG. 2 is a view illustrating a transfer robot of the substrate treating apparatus according to some exemplary embodiments of the present disclosure;

FIG. 3 is a perspective view illustrating a baking device according to some exemplary embodiments of the present disclosure;

FIG. 4 is a plan view illustrating the baking device according to some exemplary embodiments of the present disclosure;

FIG. 5 is a cross-sectional view illustrating the baking device according to some exemplary embodiments of the present disclosure;

FIG. 6 is a perspective view illustrating a transfer unit according to a first exemplary embodiment of the present disclosure;

FIG. 7 is a cross-sectional view illustrating a form in which a substrate is supported by a first tip of the transfer unit according to a first exemplary embodiment of the present disclosure;

FIG. 8 is a cross-sectional view illustrating a form in which the substrate is supported by a second tip of the transfer unit according to a first exemplary embodiment of the present disclosure;

FIG. 9 is a cross-sectional view illustrating a form in which a bending direction of a bimetal of the transfer unit according to a first exemplary embodiment of the present disclosure is changed;

FIG. 10 is a cross-sectional view illustrating a form in which a substrate is supported by a first tip of the transfer unit according to a second exemplary embodiment of the present disclosure; and FIG. 11 is a cross-sectional view illustrating a form in which the substrate is supported by a second tip of the transfer unit according to a second exemplary embodiment of the present disclosure.

DETAILED DESCRIPTION OF THE EMBODIMENTS

Hereinafter, exemplary embodiments of the present disclosure will be described in detail with reference to the accompanying drawings. Advantages and features of the present disclosure and methods for accomplishing these advantages and features will become apparent from exemplary embodiments to be described later in detail with reference to the accompanying drawings. However, the present disclosure is not limited to exemplary embodiments to be disclosed below, but may be implemented in various different forms, these exemplary embodiments will be provided only in order to make the present disclosure complete and allow one of ordinary skill in the art to which the present disclosure pertains to completely recognize the scope of the present disclosure, and the present disclosure will be defined by the scope of the claims. Throughout the specification, the same components will be denoted by the same reference numerals.

The terms as used herein are for describing exemplary embodiments rather than limiting the present disclosure. In the present specification, a singular form includes a plural form unless stated otherwise in the phrase. Components, steps, operations, and/or elements mentioned by the terms "comprise" and/or "comprising" as used herein do not exclude the existence or addition of one or more other components, steps, operations, and/or elements.

FIG. 1 is a view illustrating a substrate treating apparatus according to some exemplary embodiments of the present disclosure, and FIG. 2 is a view illustrating a transfer robot of the substrate treating apparatus according to some exemplary embodiments of the present disclosure.

Referring to FIGS. 1 and 2, a substrate treating apparatus 1 may include a buffer chamber 10, a transfer unit 20, and treating modules 30 and 40.

The buffer chamber 10 may be provided between an index module (not illustrated) and the transfer unit 20. However, the present disclosure is not limited thereto. The buffer chamber 10 may receive substrates W from containers T disposed in the index module and store a plurality of substrates W together. The substrates W stored in the buffer chamber 10 may be carried in or out by an index robot (not illustrated) and a transfer robot 20RB.

The transfer unit 20 may transfer the substrate W between the treating modules 30 and 40. The transfer unit 20 may be provided with a guide rail 20GR and a transfer robot 20RB. The guide rail 20GR may extend along a moving path of the transfer robot 20RB, and the transfer robot 20RB may be provided to be movable on the guide rail 20GR.

The transfer robot 20RB may be provided outside a housing part 110 and move between an entrance 112 of the housing part 110 and a cooling unit 120 to transfer the substrate W on a chill plate 151 or seat the substrate W on the chill plate 151.

The transfer robot 20RB may have a hand 21 on which the substrate W is put. The hand 21 may be provided to be capable of moving forward and backward and rotating around and moving along a vertical axis.

The hand 21 may have a ring shape of which one side is opened and an inner diameter is greater than or equal to a diameter of the substrate W. A plurality of support protrusions 23 may be provided on an inner circumferential surface of the hand 21. The support protrusions 23 may support an edge area of the substrate W. As an example, four support protrusions 23 may be provided at equal intervals (see FIG. 2).

The treating modules 30 and 40 may perform processes such as an applying process and/or a developing process on the substrate W. As an example, the treating modules 30 and 40 may include liquid treating devices 30 and heat treating devices 40.

The liquid treating device 30 may include a nozzle (not illustrated) and a chuck (not illustrated), and may perform a liquid film treating process of applying a photoresist.

The heat treating device 40 may perform a pre-baking process performed before performing the liquid film treating process on the substrate W or a baking process of heating the substrate W on which the liquid film treating process has been performed. However, the present disclosure is not limited thereto.

Hereinafter, the heat treating device 40 will be described with reference to the drawings. The heat treating device 40 may be, for example, a baking device 100.

FIGS. 3 to 5 are views illustrating a baking device according to some exemplary embodiments of the present disclosure.

Referring to FIGS. 3 to 5, the baking device 100 may include a housing part 110, a cooling unit 120, a heating unit 140, and a transfer unit 150.

Briefly, the substrate W may be provided to be movable by the transfer unit 150 inside the housing part 110. After the substrate W moves to a top of the heating unit 140 by the transfer unit 150, the transfer unit 150 may get out of the heating unit 140 and the substrate W may be heated in a closed treating space (not illustrated) of the heating unit 140. In addition, the substrate W may be transferred by the transfer unit 150 and be cooled in an indirect manner by the cooling unit 120 on the transfer unit 150.

The housing part 110 may have a box structure having an accommodation space formed therein. The housing part 110 may have an entrance 112 through which the substrate W goes in and out. The movement of the substrate W through the entrance 112 may be performed by the transfer robot 20RB. The cooling unit 120 and the heating unit 140 may be installed to neighbor to each other within the housing part 110.

The cooling unit 120 may be disposed adjacent to the entrance 112, and the heating unit 140 may be disposed farther from the entrance 112 than the cooling unit 120 is. The cooling unit 120 may include a cooling plate 122 having a disk shape and an elevating member 124 moving the cooling plate 122 up and down. The cooling plate 122 may include cooling means 123. As an example, the cooling means 123 may be provided with a flow passage through which a cooling fluid flows.

The cooling plate 122 may be elevated by the elevating member 124 to come into contact with the chill plate 151, so as to cool the chill plate 151. In addition, when the chill plate 151 moves above the cooling plate 122, the cooling plate 122 may descend so that the chill plate 151 is not affected by the cooling plate 122. As an example, the elevating member 124 may be provided as a vertical driving device such as a cylinder.

The heating unit 140 may include a baking chamber 141, a heating plate 142, and lift pins 144.

The baking chamber 141 may have a treating space formed therein, and may include a lower body 1411, an upper body 1412, an actuator 1413, and an exhaust line 141L.

The lower body 1411 may have a cylindrical structure of which a top is opened, and may be installed with the heating plate 142. The upper body 1412 may have a cylindrical structure of which a bottom is opened, and may cover the lower body 1411 above the lower body 1411 so that a treating space for heating the substrate W is formed between the upper body 1412 and the heating plate 142.

The actuator 1413 may be coupled to the upper body 1412 (or the lower body 1411). The actuator 557 may adjust a distance between the lower body 1411 and the upper body 1412 spaced apart from each other, and close or open the treating space by elevating or lowering the upper body 1412 as an example. As an example, the actuator 557 may be provided as a cylinder actuator. However, the present disclosure is not limited thereto.

The exhaust line 141L may be installed in the baking chamber 141 so as to exhaust fumes and/or an exhaust gas generated in a baking process of the baking chamber 141. The exhaust line 141L may be provided above the substrate W in the baking chamber 141. As an example, the exhaust line 141L may extend from the upper body 1412 to the outside of the housing part 110 to exhaust the exhaust gas to the outside. Although not illustrated in the drawings, a forced exhaust device such as a fan and/or a pump, a pressure reducing valve, an exhaust control valve, and the like, may be provided in the exhaust line 141L.

In addition, an inflow hole H1 spaced apart from the exhaust line 141L may be formed in the upper body 1412 of the baking chamber 141 so that outside air of the baking chamber 141 may flow into the treating space.

A guide plate 141G may be installed at an inlet (lower end) of the exhaust line 141L. For example, the guide plate 141G may be provided to be spaced apart from an inner lower surface of the upper body 1412 of the baking chamber 141 so as not to block the inflow hole H1. The exhaust line 141L may penetrate through a central portion of the guide plate 141G, such that the air flowing into the inflow hole H1 may move along the guide plate 141G and be then exhausted through the exhaust line 141L. In this case, the fumes and the exhaust gas may be exhausted together.

The heating plate 142 may be provided as a circular plate and may support the substrate W in the treating space. The heating plate 142 may be coupled to the lower body 1411 of the baking chamber 141.

A heating member (not illustrated) for heating the substrate may be provided in the heating plate 142. As an example, the heating member may be provided as a heater having a heat generating pattern structure and may have a multi-division structure. That is, the heating member may be provided as a plurality of heaters in the heating plate 142, and a plurality of heating zones may be provided in an area of the heating plate 142 by the plurality of heaters. For example, the respective heaters may be provided so that their temperatures may be independently adjusted. Each heater may be provided as a component in which heat is generated like a thermoelectric element. However, the present disclosure is not limited thereto.

The lift pins 144 may be provided to penetrate through the heating plate 142 and be moved up and down by an elevating mechanism (not illustrated). The lift pins 144 may be elevated to lift the substrate W from the heating plate 142 or be lowered to seat the substrate W on the heating plate 142.

The transfer unit 150 may transfer the substrate inside the baking device 100. As an example, the transfer unit 150 may include the chill plate 151, an arm 153, and a rail part 154.

The chill plate 151 may support the substrate W put thereon, and may move along the rail part 154 to transfer the substrate W. The chill plate 151 may be formed in a circular shape and may have the same diameter as the substrate W, but is not limited thereto.

A guide hole 1511 and notches 1513 may be formed in the chill plate 151.

The guide hole 1511 may have a slit shape in which it extends inward from an edge of the chill plate 151 so that the chill plate 151 does not interfere with the lift pins 144. Accordingly, when the chill plate 151 moves to a position above the heating plate 142 in order to unload the substrate W from the heating plate 142, the guide hole 1511 only moves toward the lift pins 144 and does not interfere with the lift pins 144, such that the chill plate 151 may move without being obstructed by the lift pins 144.

The notches 1513 may be formed at an edge of the chill plate 151. The notches 1513 may be provided in the same shape, position, and number as the support protrusions 23 formed on the hand 21 of the transfer robot 20RB.

When vertical positions of the hand 21 and the chill plate 151 are changed at a position where the chill plate 151 and the hand 21 are aligned with each other in a vertical direction, the substrate W may be transferred between the hand 21 and the chill plate 151.

The chill plate 151 may be provided with a cooling flow passage 1515 through which a cooling fluid passes, like or similar to the cooling means 123 of the cooling unit 120. In addition, the chill plate 151 may be made of a material (e.g., a metal) having good thermal conductivity so that heat exchange with the cooling plate 122 is rapidly performed.

The substrate W put on the chill plate 151 according to the present exemplary embodiment may be supported by first support parts (e.g., first tips 1517) or second support parts 1519 according to a temperature. This may be achieved by supporting the substrate W by the first support parts at a first temperature and supporting the substrate W by the second support parts 1519 at a second temperature, by the second support parts 1519 whose height is changed according to the temperature. This will be described later with reference to FIGS. 6 to 9.

The arm 153 may be connected to the chill plate 151 and may be installed on the rail part 154. The arm 153 is provided with a motor (not illustrated) and may move along the rail part 154 by driving of the motor. The rail part 154 may be provided so that the arm 153 is movable.

In other words, the transfer unit 150 may transfer the substrate W by having a structure in which the chill plate 151 moves between a first position where the cooling unit 120 is positioned and a second position where the heating unit 140 is positioned inside the housing part 110. In addition, the chill plate 151 may be cooled by heat exchange with the cooling plate 122 to cool the substrate W.

Hereinafter, the transfer unit 150 supporting the substrate W will be described with reference to the drawings.

FIG. 6 is a perspective view illustrating a transfer unit according to a first exemplary embodiment of the present disclosure. FIGS. 7 to 9 are cross-sectional views illustrating a form in which a height of a substrate on the transfer unit according to a first exemplary embodiment of the present disclosure is changed according to a temperature.

Referring to FIGS. 6 to 9, the chill plate 151 of the transfer unit 150 may have an accommodation groove 151H formed to be concave downwardly in addition to the guide hole 1511 and the notches 1513, and may include the first support parts (e.g., the first tips 1517) and the second support parts 1519.

The chill plate 151 may have a first area constituting a central portion and a second area including an edge outside the first area. The first area and the second area are for convenience of explanation and understanding, and may refer to a central area and an outer area, respectively.

Heights of the first tip 1517 and a second tip 1519T to be described below refer to heights of a gap between the chill plate 151 and the substrate W, and refer to heights from the chill plate 151 to upper ends of the first and second tips 1517 and 1519T, even though not separately described.

Briefly, the substrate W put on the chill plate 151 may be supported by the first support parts or the second support parts 1519 according to the temperature. This may be achieved by supporting the substrate W by the first support parts at a first temperature and supporting the substrate W by the second support parts 1519 at a second temperature, by the second support parts 1519 whose height is changed according to the temperature.

The first temperature may be higher than the second temperature and may be a temperature around the first support part. That is, the first temperature may refer to a state in which the substrate W is heated, and may be a temperature at a point in time when the substrate W exits the baking chamber 141 and needs to be cooled.

At the first temperature, a height (e.g., 60 μm or less) of the first tip 1517 may be set so that a height of the gap between the substrate W and the chill plate 151 is low, in order to allow the substrate W to be supported by the first tip 1517 and prevent a decrease in cooling efficiency of the substrate W.

The second temperature may be lower than the first temperature and may be a temperature around the second support part 1519. That is, the second temperature may be a temperature in a state in which the heated substrate W is being cooled or cooling of the heated substrate W has been completed. At the second temperature, the substrate W may be supported by the second tip 1519T, and the second tip 1519T may have a height (e.g., 100 μm or more) at which a squeeze effect is minimized or prevented when the substrate W is transferred by the transfer robot 20RB.

The first support parts may be installed on the chill plate 151, a plurality of first support parts may be provided radially to be adjacent to the edge in the second area as compared with the first area, and a plurality of first support parts may be provided radially to be spaced apart from each other at equal intervals in the first area. The first support parts may be disposed at different angles with respect to a central point in the first area and the second area and be provided to be misaligned with each other in the first area and the second area. However, the present disclosure is not limited thereto.

The first support part may include the first tip 1517. The first tip 1517 may have a first height D1 (see FIG. 7). The first height is a height from the chill plate 151 to an upper end of the first tip 1517, and may be a height between 20 μm and 60 μm.

The first tip 1517 and the second tip 1519T may be made of, for example, polyetheretherketone (PEEK). However, the present disclosure is not limited thereto.

The second support parts 1519 may be installed on the chill plate 151. The second support parts 1519 may be adjacent to the first support parts, and may be provided in at least the same number as the number of first support parts (first tips 1517).

The second support part 1519 may include a bimetal 1519B and the second tip 1519T.

The bimetal 1519B may include two metal plates having different expansion rates, may be a component changing a height of the second tip 1519T according to a temperature change, may have flatness or a bending direction changed according to a temperature, and may be provided in the accommodation groove 151H.

For example, the bimetal 1519B may be bent downward at the first temperature (see FIG. 7) and be flat at the second temperature. However, the present disclosure is not limited thereto, and the bimetal 1519B may also be bent upward at the second temperature (see FIGS. 8 and 9).

At the first temperature, a maximum height of the second tip 1519T becomes equal to or lower than the height of the first tip 1517, such that the substrate W may be supported by the first tip 1517 of the first support part.

The heated substrate W may be cooled by the cooling unit 120, such that a temperature may be lowered from the first temperature to the second temperature. When the temperature is lowered to the second temperature, a shape of the bimetal 1519B is changed by the temperature, so that the height of the bimetal 1519B may be changed.

That is, at the second temperature, the second tip 1519T becomes higher than the first tip 1517, and has a height of 100 μm to 500 μm from the chill plate 151 (e.g., see D2 of FIG. 9 as a second height), such that the substrate W may be supported by the second tip 1519T of the second support part 1519.

Hereinafter, a modified example of the present exemplary embodiment will be described with reference to FIGS. 10 and 11, and an overlapping description of the same components performing the same functions will be omitted.

FIGS. 10 and 11 are views for describing a transfer unit according to a second exemplary embodiment of the present disclosure. Contents different from those described with reference to FIGS. 6 to 9 will be mainly described with reference to FIGS. 10 and 11.

Referring to FIGS. 10 and 11, in a transfer unit 150 according to a second exemplary embodiment, like or similar to a first exemplary embodiment, a chill plate 151 includes a guide hole 1511, notches 1513, first support parts (e.g., first tips 1517), and second support parts 1519.

Meanwhile, the second support part 1519 according to a second exemplary embodiment includes a ball plunger 1519P and a vacuum line 1519V, unlike the second support part 1519 according to a first exemplary embodiment including the bimetal 1519B and the second tip 1519T.

However, another exemplary embodiment is possible by a combination of one or more of first and second exemplary embodiments and known technologies, and various modified examples such as a modified example in which the second support part 1519 includes the bimetal 1519B and the ball plunger 1519P that neighbor to each other and are provided together and the bimetals 1519B and the ball plungers 1519P that are alternately provided are possible by a combination of first and second exemplary embodiments.

A vacuum atmosphere is formed or broken according to a temperature, such that a height of the second support part 1519 according to a second exemplary embodiment may be changed.

For example, the ball plunger 1519P may be provided as a spring plunger including a spring, and may be provided to be able to protrude from the chill plate 151 as long as it is not separated from the chill plate 151. That is, the ball plunger 1519P may be provided to move in the vertical direction without being separated from the chill plate 151 while being caught by the chill plate 151.

The vacuum line 1519V may form or break the vacuum atmosphere by communicating with a bottom of the ball plunger 1519P so that a height of the ball plunger 1519P is changed. The vacuum line 1519V may be provided with a pressure change device (not illustrated) decreasing an internal pressure, such as a pump.

Referring to FIG. 10, the vacuum line 1519V may form the vacuum atmosphere so that the substrate W is supported by the first tip 1517 at the first temperature.

For example, when the vacuum line 1519V forms the vacuum atmosphere in a lower space in which the ball plunger 1519P is installed by an operation of the pump, the ball plunger 1519P operates in a direction in which a volume of the lower space is decreased, such that the ball plunger

1519P may move downward, and thus, a height of the ball plunger 1519P may be decreased. Accordingly, the substrate W may be supported by the first tip 1517 having a first height D1 (see FIG. 10).

Meanwhile, referring to FIG. 11, a height of the second support part 1519 may be restored so that the substrate W is supported by the second support part 1519 at the second temperature.

To this end, the vacuum line 1519V may break the vacuum atmosphere, which may be achieved through inflow of air. Although not illustrated in the drawings, the vacuum line 1519V may be provided with a structure in which a vent line is branched to break the vacuum atmosphere. However, the present disclosure is not limited thereto. In addition, various modified examples such as a modified example in which a structure separate or branched from the vacuum line 1519V and a line into which air flows may be provided are possible.

In the substrate treating apparatus 1 according to an exemplary embodiment as described above, the height of the gap is adjusted according to the temperature in the cooling process after the heating process of the substrate W in the baking process, such that cooling efficiency of the substrate may be improved and the occurrence of the squeeze effect at the time of transferring the substrate may be prevented.

The exemplary embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the exemplary embodiments described above are illustrative rather than being restrictive in all aspects.

What is claimed is:

1. A substrate treating apparatus comprising:
   a chill plate;
   a first support part installed on the chill plate and including a first tip having a first height; and
   a second support part installed on the chill plate and having a height changed according to a temperature,
   wherein:
   at a first temperature, a maximum height of the second support part becomes equal to or lower than a height of the first tip, such that the substrate is supported by the first tip of the first support part,
   at a second temperature lower than the first temperature, the second support part becomes higher than the first tip, such that the substrate is supported by the second support part,
   the second support part includes a bimetal having flatness or a bending direction changed according to a temperature and a second tip provided on the bimetal,
   at the first temperature, the bimetal is bent downward, and a maximum height of the second tip becomes lower than the height of the first tip, such that the substrate is supported by the first tip, and
   at the second temperature, the bimetal is restored or bent upward, and the second tip is higher than the first tip, such that the substrate is supported by the second tip.

2. The substrate treating apparatus of claim 1, wherein the first height is a height between 20 μm and 60 μm.

3. The substrate treating apparatus of claim 1, wherein at the second temperature, a height of the second support part from the chill plate is 100 μm to 500 μm.

4. The substrate treating apparatus of claim 1, wherein the second support part includes:

a ball plunger provided to protrude from the chill plate; and a vacuum line forming or breaking a vacuum atmosphere by communicating with a bottom of the ball plunger so that a height of the ball plunger is changed.

5. The substrate treating apparatus of claim 1, wherein the chill plate has an accommodation groove provided with the bimetal and formed to be concave downwardly.

6. The substrate treating apparatus of claim 1, wherein the first support part is provided as a plurality of first support parts, the second support part is implemented as a plurality of second support parts, the plurality of second support parts are adjacent to the plurality of first support parts, and are provided in at least the same number as the number of the plurality of first support parts.

7. The substrate treating apparatus of claim 6, wherein the chill plate has a first area constituting a central portion and a second area including an edge of the chill plate outside the first area, and the plurality of first support parts are provided radially to be adjacent to the edge in the second area as compared with the first area.

8. The substrate treating apparatus of claim 7, wherein the plurality of first support parts are further provided radially to be spaced apart from each other at equal intervals in the first area, and the plurality of first support parts are disposed at different angles with respect to a central point in the first area and the second area and are provided to be misaligned with each other in the first area and the second area.

9. The substrate treating apparatus of claim 1, wherein the chill plate has a guide hole extending inward from an edge of the chill plate so that the chill plate does not interfere with lift pins penetrating through a heating plate and having a slit shape.

10. A substrate treating apparatus comprising:

a cooling unit positioned at a first position and including a cooling plate cooling a substrate;

a heating unit positioned at a second position and including a heating plate heating the substrate and lift pins provided to be elevated or lowered from the heating plate;

a transfer unit including a chill plate supporting the substrate so as to transfer the substrate, an arm connected to the chill plate and moving between the first position and the second position, and a rail part provided to allow the arm to move; and a housing part having an accommodation space in which the cooling unit, the heating unit, and the transfer unit are accommodated and provided with an entrance through which the substrate goes in and out, wherein the transfer unit further includes:

a first support part installed on the chill plate and including a first tip having a first height; and a second support part including a bimetal installed on the chill plate and having flatness or a bending direction changed according to a temperature and a second tip provided on the bimetal, at a first temperature, a maximum height of the second tip becomes equal to or lower than a height of the first tip, such that the substrate is supported by the first tip of the first support part, and at a second temperature lower than the first temperature, the second tip becomes higher than the first tip, such that the substrate is supported by the second tip of the second support part.

11. The substrate treating apparatus of claim 10, further comprising a transfer robot provided outside the housing part and moving between the entrance and the cooling unit to transfer the substrate on the chill plate or seat the substrate on the chill plate.

12. The substrate treating apparatus of claim 10, wherein the first height is 20 μm to 50 μm, and the chill plate has an accommodation groove provided with the bimetal and formed to be concave downwardly.

13. The substrate treating apparatus of claim 10, wherein at the second temperature, a minimum height of the second tip from the chill plate is 100 μm or more.

14. The substrate treating apparatus of claim 13, wherein at the second temperature, a maximum height of the second tip from the chill plate is 500 μm or less.

15. The substrate treating apparatus of claim 10, wherein the first support part is provided as a plurality of first support parts, the second support part is implemented as a plurality of second support parts, the plurality of second support parts are adjacent to the plurality of first support parts, and are provided in at least the same number as the number of the plurality of first support parts.

16. The substrate treating apparatus of claim 15, wherein the chill plate has a first area constituting a central portion and a second area including an edge of the chill plate outside the first area, and the first support part is provided as a plurality of first support parts, and the plurality of first support parts are provided radially to be adjacent to the edge in the second area as compared with the first area.

17. The substrate treating apparatus of claim 16, wherein the plurality of first support parts are further provided radially to be spaced apart from each other at equal intervals in the first area, and the first support parts are disposed at different angles with respect to a central point in the first area and the second area and are provided to be misaligned with each other in the first area and the second area.

18. The substrate treating apparatus of claim 10, wherein the chill plate has a guide hole extending inward from an edge of the chill plate so that the chill plate does not interfere with the lift pins and having a slit shape along a direction in which it moves between the first position and the second position.

19. A substrate treating apparatus comprising:

a chill plate having an accommodation groove formed to be concave downwardly, having a guide hole extending inward from an edge of the chill plate so that the chill plate does not interfere with lift pins penetrating through a heating plate and having a slit shape, having a cooling flow passage through which a cooling fluid passes, and having a first area constituting a central portion and a second area including an edge outside the first area;

a plurality of first support parts installed on the chill plate, provided radially to be adjacent to the edge in the second area as compared with the first area, further provided radially to be spaced apart from each other at equal intervals in the first area, and including first tips having a height between 20 to 60 μm from the chill plate; and second support parts including bimetals installed on the chill plate and having flatness or a bending direction changed according to a temperature and second tips provided on the bimetals, and adjacent to the plurality of first support parts and provided in at least the same number as the number of the plurality of first support parts, wherein at a first temperature, a maximum height of the second tips becomes equal to or lower than a height of the first tips, such that the substrate is supported by the first tips of the plurality of first support parts, and at a second temperature lower than the first temperature, the second tips become higher than the first tips, such that a height of the second tips from the chill plate is 100 μm to 500 μm and the substrate is supported by the second tips of the second support parts.

\* \* \* \* \*